United States Patent [19]

Wourms

[11] 4,361,599
[45] Nov. 30, 1982

[54] METHOD OF FORMING PLASMA ETCHED SEMICONDUCTOR CONTACTS

[75] Inventor: Robert L. Wourms, Santa Clara, Calif.

[73] Assignee: National Semiconductor Corporation, Santa Clara, Calif.

[21] Appl. No.: 246,527

[22] Filed: Mar. 23, 1981

[51] Int. Cl.³ .......................... B05D 5/12; B44C 1/22; C03C 15/00; C03C 25/06
[52] U.S. Cl. ........................................ 427/90; 29/591; 148/187; 156/643; 156/644; 156/646; 156/653; 156/657; 156/661.1; 204/192 E; 357/71; 430/312; 430/313; 430/317
[58] Field of Search ................ 156/643, 646, 653, 657, 156/659.1, 661.1, 662, 668, 644; 148/187; 204/164, 192 EC, 192 E, 298; 427/88–91; 430/313, 316, 317, 312, 318; 357/65, 67, 71; 29/571, 580, 591

[56] References Cited
U.S. PATENT DOCUMENTS

| | | |
|---|---|---|
| 3,546,013 | 12/1970 | Perri et al. ..................... 427/193 X |
| 3,708,360 | 1/1973 | Wakefield et al. ............. 156/653 X |
| 3,716,428 | 2/1973 | Amouroux et al. ............. 156/657 X |
| 4,141,022 | 2/1979 | Sigg et al. ........................ 357/67 X |
| 4,184,909 | 1/1980 | Chang et al. ....................... 156/643 |
| 4,283,439 | 8/1981 | Higashinakagawa et al. ..... 156/657 X |

Primary Examiner—William A. Powell
Attorney, Agent, or Firm—Gail W. Woodward; Neil B. Schulte; Paul J. Winters

[57] ABSTRACT

In the fabrication of semiconductor devices it has been found useful to employ plasma etching to create contact holes in the insulating layers that cover the wafers being processed. In particular, when wafers are being fabricated that employ small diameter contacts, it is difficult to ensure that all contact holes are created simultaneously. If etching is continued sufficiently to make sure that all of the contact holes over the wafer are fully etched, it is found that a certain proportion are overetched. If the silicon semiconductor is converted to a metal silicide in the region where contact is to be made subsequently, its plasma etch rate can be reduced sufficiently to avoid overetching.

8 Claims, 6 Drawing Figures

METHOD OF FORMING PLASMA ETCHED SEMICONDUCTOR CONTACTS

BACKGROUND OF THE INVENTION

The invention relates to the processing of semiconductor devices and is specifically related to plasma etching wherein a CF$_4$ plasma is employed to generate reactive ions that can attack silicon. Reference is made to a paper by Mogab, Adams, and Flamm titled "PLASMA ETCHING OF Si AND SiO$_2$—THE EFFECT OF OXYGEN ADDITIONS TO CF$_4$ PLASMAS" published in the July, 1978, issue of the Journal of Applied Physics on pages 3796–3803. J. A. Bondur and H. A. Clark published a paper titled "PLASMA ETCHING FOR SiO$_2$ PROFILE CONTROL" in the April, 1980, issue of Solid State Technology on pages 122–128. These papers show that photoresists can be used to locally etch holes in the oxide that overlies a silicon substrate so that metal contacts can be applied to the silicon. Since the oxide can be made to etch faster than the silicon, the plasma etch process has achieved considerable significance in the semiconductor device processing art.

In modern semiconductor device technology sizes have been scaled down and it is often desirable to create micron sized contacts to the silicon. This is close to the limit attainable using present photolithographic techniques because a micron is on the order of the wavelength of visible light. Actually such a contact diameter is about the same size as the thickness of the surface passivation layer which is usually predominantly SiO$_2$. It has been found that it is increasingly difficult to properly etch smaller contact holes. At the micron size it is found that on some parts of a semiconductor wafer the contacts will penetrate the oxide down to the silicon. However, in other areas extending etching must be employed to ensure proper penetration. In this case the contacts that were sufficiently etched originally will now be overetched and will either penetrate into the silicon or will be oversized due to lateral oxide etching. In any event a reliable contact formation becomes difficult to achieve over the entire surface of a wafer.

SUMMARY OF THE INVENTION

It is an object of the invention to provide a process that permits the reliable etching of very small contact holes over the surface of a semiconductor device wafer.

It is a further object of the invention to employ a silicide to reduce the etch rate of silicon in a plasma contact etching process.

These and other objects are achieved as follows. In a silicon wafer containing diffused contact regions to which contact is to be made, a relatively thin thermal oxide is first grown. Then, where contacts are desired, the oxide is removed photolithographically. Then a coating of metal is applied over the surface of the wafer. The metal is selected for its ability to form a silicide that etches at a slower rate than the silicon. Then the metal is reacted by heating to form a silicide where it touches the bare silicon. In those regions where the thin oxide prevents contact with the silicon there is no reaction. The unreacted metal is then removed in a selective etch. Then a relatively thick passivating layer is deposited over the wafer. At this point the wafer is coated with a photoresist which is exposed through the same mask that was used to process the thin oxide. After resist development the thick oxide is plasma etched with the photoresist acting to define the etched regions. The thick oxide is thus removed over the silicided areas which act to resist the plasma etch once the thick oxide is penetrated. The plasma etch can be extended to ensure that all of the contact will be completely etched over the entire wafer without encountering any local overetching.

DESCRIPTION OF THE INVENTION

Figure 1:
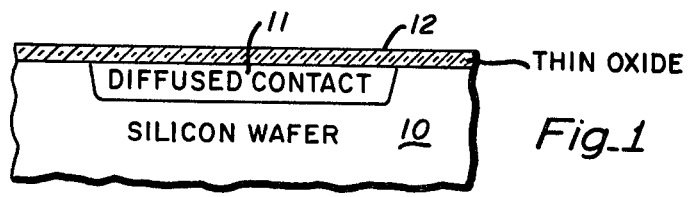
FIGS. 1–6 show a cross section of a fragment of a silicon wafer in various stages of processing to create a contact to a diffused region.

In the description to follow the drawing is not to scale but is exaggerated to show the nature of the invention.

FIG. 1 shows a cross section of a silicon wafer fragment 10 into which a contact 11 has been diffused. The wafer could be of one conductivity type and the diffused region of the opposite type. It is desired to make a small area contact to the diffused region. This fragment represents a small piece of a semiconductor wafer into which an integrated circuit is being fabricated. Diffused region 11 is relatively heavily doped so that when metal contact is made to it the contact will be substantially ohmic.

First, as shown in FIG. 1, a relatively thin oxide 12 is formed on the wafer surface. It is preferred that this oxide is thermally grown to a thickness of about 0.1 micron.

Figure 2:
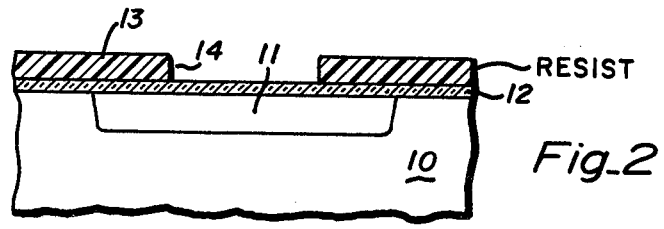

Then, as shown in FIG. 2, a photoresist 13 is applied to the wafer and an opening 14 created in the conventional manner. It is to be understood that opening 14 is related to the artwork in an exposure mask (not shown) which is part of the photolithographic process used in IC manufacturing. The thin oxide inside opening 14 is then removed by immersion in a conventional oxide etch such as buffered hydrofluoric acid. Alternatively, a plasma or dry etch could be employed. Since oxide 12 is thin, the hole etched through it will be of substantially the same size as that in the photoresist. Thus, this phase of the process will not appreciably enlarge the contact diameter.

Figure 3:
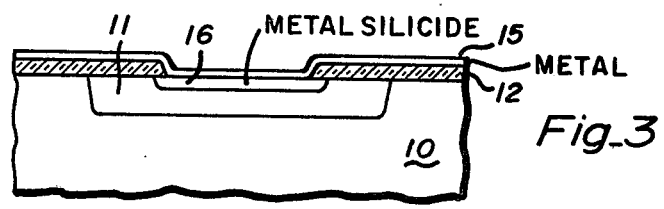
Figure 4:
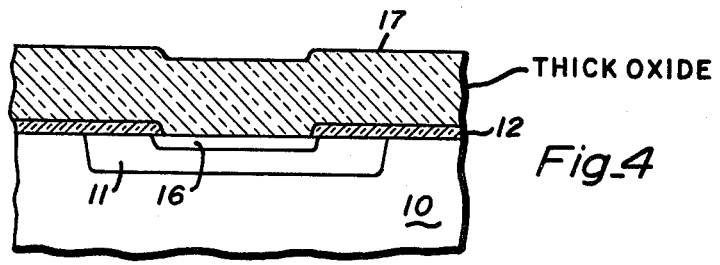

As shown in FIG. 3, a metal layer 15 is deposited over the wafer. This metal is selected for its ability to form a silicide that can form an ohmic contact to doped silicon. Platinum is preferred for layer 15 but other metals such as tungsten or molybdenum or mixtures could be used. Metal layer 15 can be applied by any convenient method such as sputtering, chemical vapor deposition, or the like. A preferred thickness is about 0.1 micron.

The wafer is then heated to a temperature at which metal 15 will react with silicon to form a silicide. For example, platinum silicide will form readily at 500° C. Thus, where metal 15 contacts the silicon through the hole in oxide 12 a silicide will form at 16. Care is taken to make sure that the silicide does not penetrate contact 11 but only extends part way through. It will be noted that silicide 16 also extends a short distance under the edges of oxide 12.

Then the unreacted portions of metal 15 are removed in a selective etch. For example, Aqua Regia will selectively remove platinum but will not attack silicon, silicide, or silicon oxide.

At this point the wafer is ready for contact formation. If desired, oxide 12 can either be removed or left intact as will be illustrated. Next a thick or so called "field oxide" layer 17 is applied. Layer 17 is preferably deposited by chemical vapor deposition and is composed primarily of silicon dioxide. Layer 17 is ordinarily made about one micron thick which is sufficient to fully passivate the IC, and act as a surface insulator that will accommodate metallization wiring.

Figure 5:
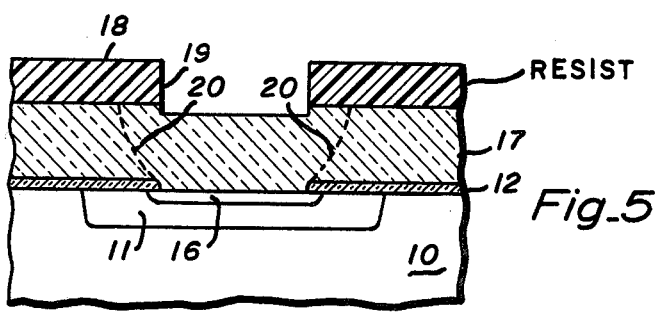

As shown in FIG. 5, a photoresist layer 18 is applied to the wafer and an opening 19 created in the conventional manner. Opening 19 can be produced using the same photographic artwork that was used to create opening 14 of FIG. 2. This means that opening 19 will be substantially aligned with silicide 16.

The wafer is then subjected to plasma etching as described in the above-referenced papers in Solid State Technology and The Journal of Applied Physics. An atmosphere of 1.6 torr of $CF_4$ mixed with 8% $O_2$ produced an etch rate of 0.07 micron per minute of layer 17 at a plasma power density of 0.9 w/cm$^2$. Dashed lines 20 show the plasma etch limits so that the portion of layer 17 inside dashed lines 20 is removed. Silicide layer 16 has a greatly reduced etch rate relative to that of silicon in the plasma etch. Accordingly, it will act as an etch stop that would not exist if only silicon were present. It will be noted that the etch proceeds under the resist so that the walls of the resulting hole are beveled. This is desirable in terms of the coverage of the edges of the hole in subsequent metallization. I have found that the presence of the silicide will sufficiently reduce the etch rate that the plasma etch can be extended long enough to ensure the complete etching of all contacts on a wafer without any evidence of overetching.

Figure 6:
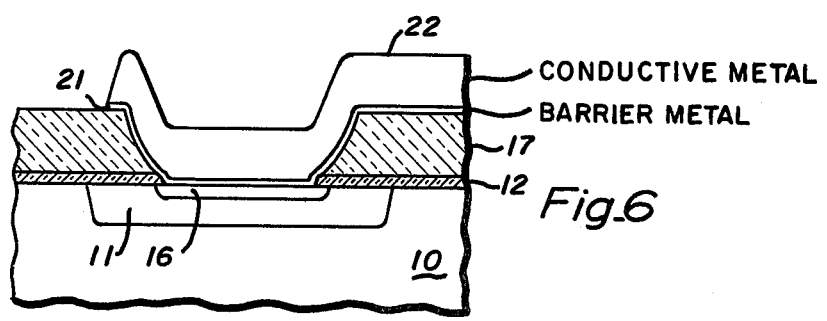

FIG. 6 shows a final metallization applied to a plasma etched contact. Silicide 16 is first contacted with a thin layer 21 of a nonreactive barrier metal such as a Titanium-Tungsten alloy or equivalent. Layer 21 is made about 0.1 micron thick. Then an aluminum metallization layer 22 about one micron thick is applied. Ordinarily layers 21 and 22 are applied completely over the semiconductor wafer and they are photolithographically etched to create the final metallization pattern. Whenever a hole has been plasma etched in the oxide coating, as described above, contact will be made to the underlying silicon.

While layer 17 was shown as $SiO_2$, it can comprise other materials. For example, it can be or can include polyimide, silicon nitride ($Si_3N_4$) deposited either by plasma or by chemical vapor deposition, or mixed oxides deposited on the silicon. Furthermore, while the process is shown being applied to a silicon wafer which is single crystal material, it can be applied to making contacts to polycrystalline silicon in substantially the same manner.

The invention has been described with emphasis upon a preferred embodiment. However, it is clear that there are alternatives and equivalents that will occur to a person skilled in the art upon reading the foregoing description. Accordingly, it is intended that the scope of the invention be limited only by the claims that follow.

I claim:

1. A process for making metal contact to a silicon substrate wherein the desired contact diameter is of the same order as the thickness of an oxide layer that overlies and passivates said silicion substrate, said process comprising the steps:

forming a relatively thin oxide over said silicon;

forming openings in said thin oxide using a photolithographic mask in those areas where contact is desired;

forming a metal silicide in said silicon in said openings;

depositing an insulator over said substrate to a thickness on the same order as the diameter of said openings;

applying an etch resist over said insulator;

opening holes in said etch resist in said contact areas using a photolithographic mask having the same artwork as that in the mask used in forming said openings;

plasma etching said insulator through said holes in said resist;

continuing said etching until all of said insulator is removed with said silicide halting said etching at said silicon surface; and depositing a contact metal over said substrate to form an ohmic contact to said silicide.

2. The process of claim 1 wherein said silicon is in the form of an integrated circuit wafer.

3. The process of claim 1 wherein said silicon is in the form of a layer of polycrystalline silicon.

4. The process of claim 1 wherein said metal is platinum.

5. The process of claim 1 wherein said metal is selected from the group consisting of platinum, molybdenum, tungsten, and mixtures thereof.

6. The process of claim 1 wherein said thick insulator is selected from the group consisting of polyimide, vapor deposited oxide, vapor deposited nitride, plasma deposited oxide and plasma deposited nitride.

7. The process of claim 1 wherein said contact metal comprises a first layer of barrier metal and a second layer of conductive metal.

8. The process of claim 7 wherein said first layer is a tungsten-titanium alloy and said second layer is aluminum.

* * * * *